(12) United States Patent
Masanori

(10) Patent No.: US 8,062,810 B2
(45) Date of Patent: Nov. 22, 2011

(54) METHOD OF CORRECTING A MASK PATTERN AND METHOD OF MANUFACTURING A SEMICONDUCTOR DEVICE

(75) Inventor: Terahara Masanori, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 594 days.

(21) Appl. No.: 12/052,965

(22) Filed: Mar. 21, 2008

(65) Prior Publication Data

US 2008/0241973 A1    Oct. 2, 2008

(30) Foreign Application Priority Data

Mar. 29, 2007    (JP) ................. 2007-089169

(51) Int. Cl.
  *G03F 1/00*    (2006.01)
  *G03F 7/00*    (2006.01)
(52) U.S. Cl. .......................................... 430/5; 430/311
(58) Field of Classification Search .............. 430/5, 311, 430/312, 313, 30; 716/19, 20, 21
See application file for complete search history.

(56) References Cited

U.S. PATENT DOCUMENTS

| | | | | |
|---|---|---|---|---|
| 6,136,478 A | * | 10/2000 | Usui et al. | 430/5 |
| 6,665,858 B2 | | 12/2003 | Miyazaki | |
| 7,103,870 B2 | * | 9/2006 | Misaka et al. | 716/21 |
| 7,638,244 B2 | * | 12/2009 | Kanai | 430/5 |

FOREIGN PATENT DOCUMENTS

| | | |
|---|---|---|
| JP | 2001-133956 A | 5/2001 |
| JP | 2002-174890 A | 6/2002 |

* cited by examiner

*Primary Examiner* — Stephen Rosasco
(74) *Attorney, Agent, or Firm* — Westerman, Hattori, Daniels & Adrian, LLP

(57) ABSTRACT

The method of manufacturing a semiconductor device has deciding an amount of a correction of a mask pattern for a size of an active region of a semiconductor substrate, correcting the mask pattern on the basis of the decided amount of the correction, and exposing a resist film by using an exposure mask having the corrected mask pattern.

10 Claims, 10 Drawing Sheets

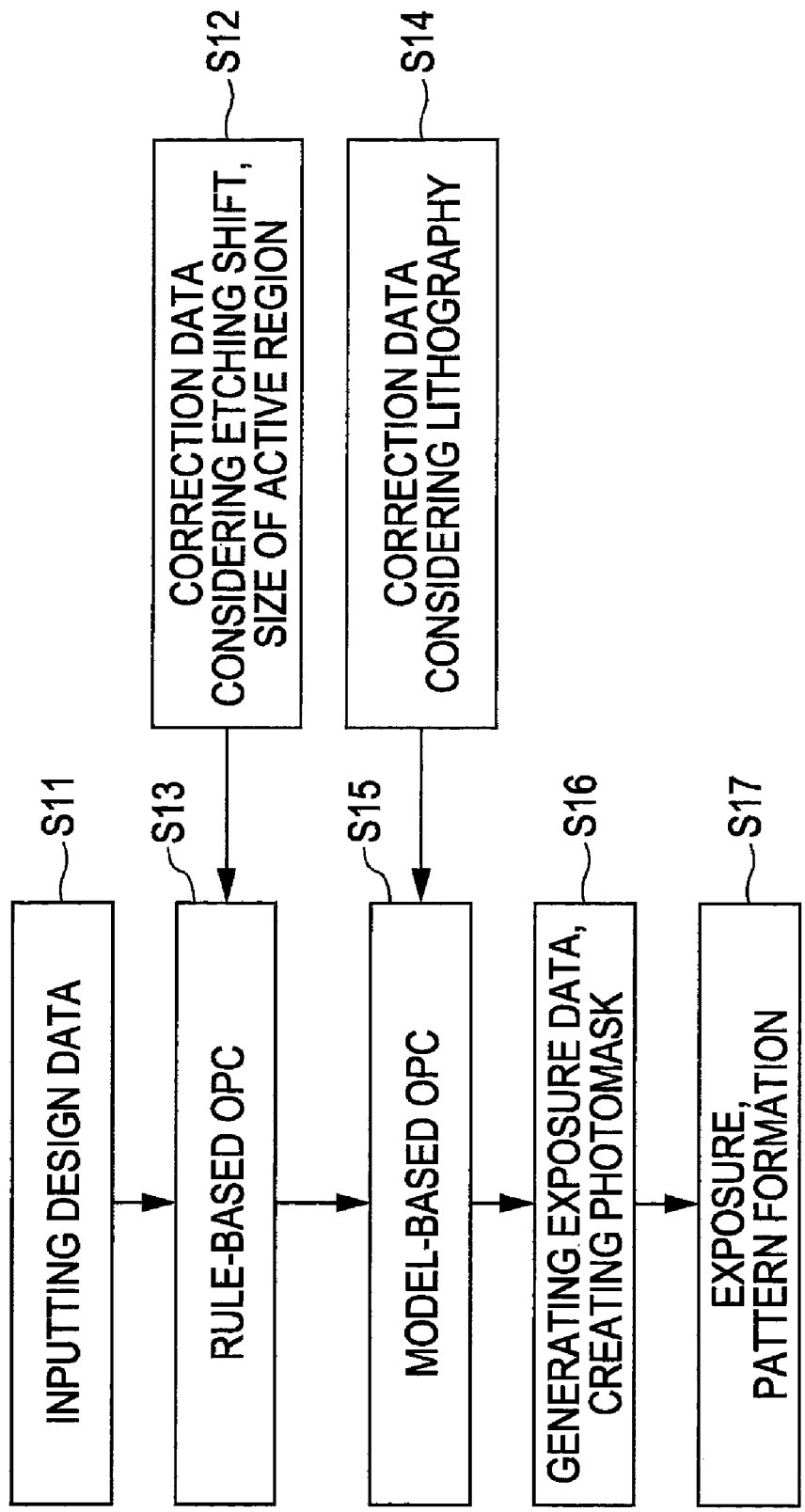

METHOD OF CORRECTING A MASK PATTERN AND METHOD OF MANUFACTURING A SEMICONDUCTOR DEVICE

BACKGROUND

In a process technique of a semiconductor integrated circuit, with the advancement in microfabrication, a mask technique has become significant, in addition to an exposure technique, in order to form a pattern with a width not more than a wavelength of light. When a Numerical Aperture (NA) is increased for forming a micropattern, a Depth Of Field (DOF) is reduced, so that the affect of a base is non-negligible when forming a pattern. For example, the variation in the width of a gate electrode, which is caused by a step of the base, significantly appears in an operation speed of a transistor or leak current, which affects the transistor performance. Therefore, a pattern that is to be actually formed is generally simulated and evaluated with the use of a mask pattern, in order to form a desired width of a gate electrode.

As semiconductor devices have been using finer patterns due to higher integration these days, the influence of an optical proximity effect appears greatly in an exposure process, making it difficult to manufacture semiconductor devices according to the design data. To prevent this from occurring, Optical Proximity Correction (OPC) technique for correcting a circuit pattern in design data has been generally employed by obtaining the influence of the optical proximity effect in order to obtain dimensions as designed.

When acquiring data for OPC, a substrate having no step of a Shallow Trench Isolation (STI) is generally employed. The substrate has no active region or no device isolation. An oxide film, polysilicon film and insulating film based hard mask material are laminated on a flat substrate, a reflection preventing film and a resist are applied thereon, and the resultant is transferred and etched with a mask having a test pattern according to various sizes such as line/space. Then, the size data after the processing is measured. A model equation is derived over the basis of this measured data and the optical simulation so as to perform a correction of a mask pattern. Specifically, the same correction is executed, regardless of a type of a transistor, and further, the difference in the size of an active region is not considered.

As represented by a transistor having different power supply voltage, a difference is produced in a retreat amount of the oxide film, for example High Density Plasma (HDP) oxide film, embedded into the STI region due to the difference in the type of ion of implanted impurity, the dosage, or the number of times of wet process. The same problem arises in the process of forming multi-gate oxide transistors. Further, the step varies depending upon the size of the active region even in transistors of the same type. As a result, there is a difference between an actual product and the result of the simulation.

Specifically, suppose the case in which an active region is formed so as to project from an STI region. The STI region has a buried insulating film 102 as shown in FIG. 1B. When the gate width (W width) or source-drain width (SD width) of the active region 110 on a silicon substrate 101 is different, as shown in FIG. 1B, in the active region 110 divided by the W width and the SD width over a source (S) region and a drain (D) region shown in FIG. 1A, the thickness of a gate oxide film 103 or a sacrificial oxide film that is to be formed varies. The reason for this is because, when the oxide film is formed, the oxidation rate in the direction of the side wall is faster, and hence, the thicker oxide film is formed in the active region with the narrow W width, compared to the active region with the wide W width, for example.

As shown in FIG. 2, the following wet process, for example hydrofluoric acid treatment process, makes a sinking amount of the active region 110 different due to the difference in the W width or the SD width of the active region 110, so that the variation of the step increases. As shown in FIGS. 3A and 3B, this step affects the application state of a reflection preventing film 105 on a gate electrode film 104 in the next gate forming process, with the result that the thickness of the reflection preventing film 105 or, depending on the situation, the thickness of the resist 106 becomes non-uniform. As a result, the DOF or reflectivity varies, whereby the non-uniform size depending upon the width of the active region is produced in the patterning for forming the gate electrode 108.

A trimming technique has recently been used in an etching in order to process a gate electrode having a smaller size than the size of the patterning. The difference in the thickness of the reflection preventing film 105 affects an etching shift amount by the trimming of the reflection preventing film 105. When the thickness of the reflection preventing film 105 differs according to the step, the etching shift of the gate electrode 108 in the processing is very likely to differ at various parts.

It is difficult, from the viewpoint of a process flow, to improve the step between the device isolation region and the active region for every type of transistor. Therefore, the influence by this step becomes a significant subject.

SUMMARY

According to an aspect of the invention, the method of manufacturing a semiconductor device includes deciding an amount of a correction of a mask pattern for a size of an active region of a semiconductor substrate, correcting the mask pattern on the basis of the decided amount of the correction, and exposing a resist film by using an exposure mask having the corrected mask pattern.

BRIEF DESCRIPTION OF THE DRAWINGS

FIG. 4 is a flowchart showing a correction of a mask pattern in a manufacturing process of a semiconductor device according to one embodiment of the present invention;

DESCRIPTION OF THE PREFERRED EMBODIMENTS

Figure 1A:
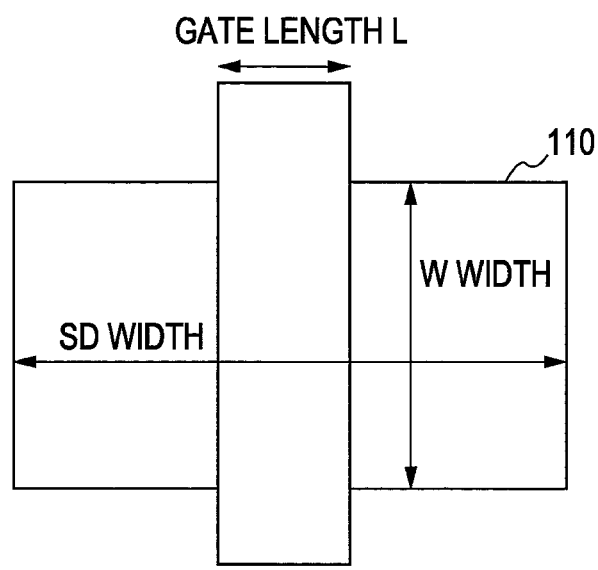
FIGS. 1A and 1B are views showing an example of a step due to a difference in a W width of an active region.
Figure 1B:
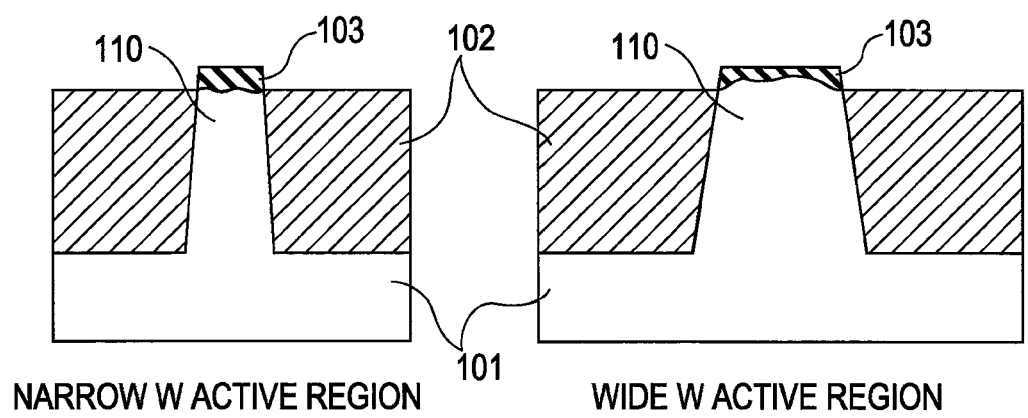
Figure 2:
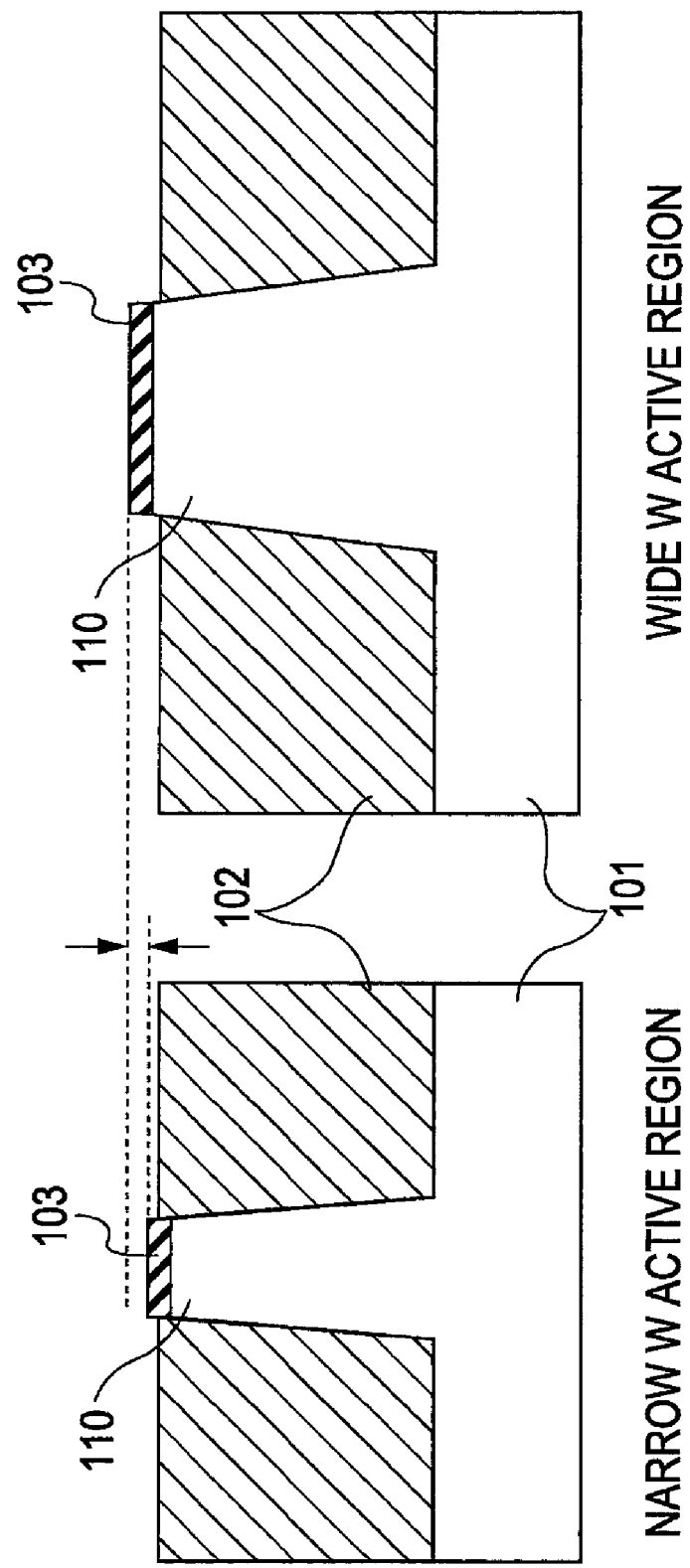
FIG. 2 is a view showing another example of a step due to a difference in a W width of an active region.
Figure 3A:
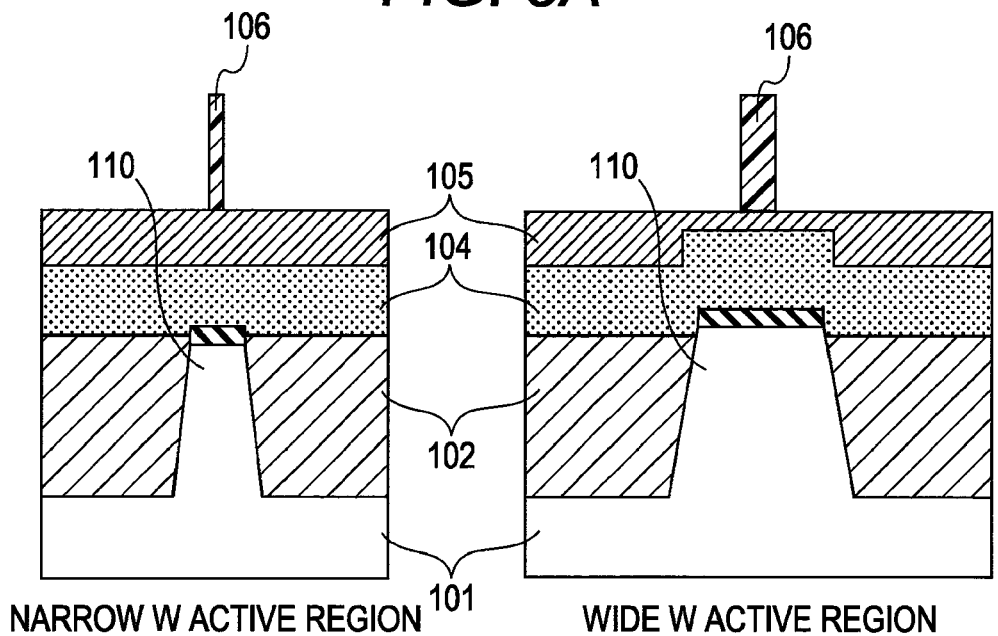
FIGS. 3A and 3B are schematic views showing a variation in a patterning width caused by a difference in a thickness of a reflection preventing film, which is caused by a step.
Figure 3B:
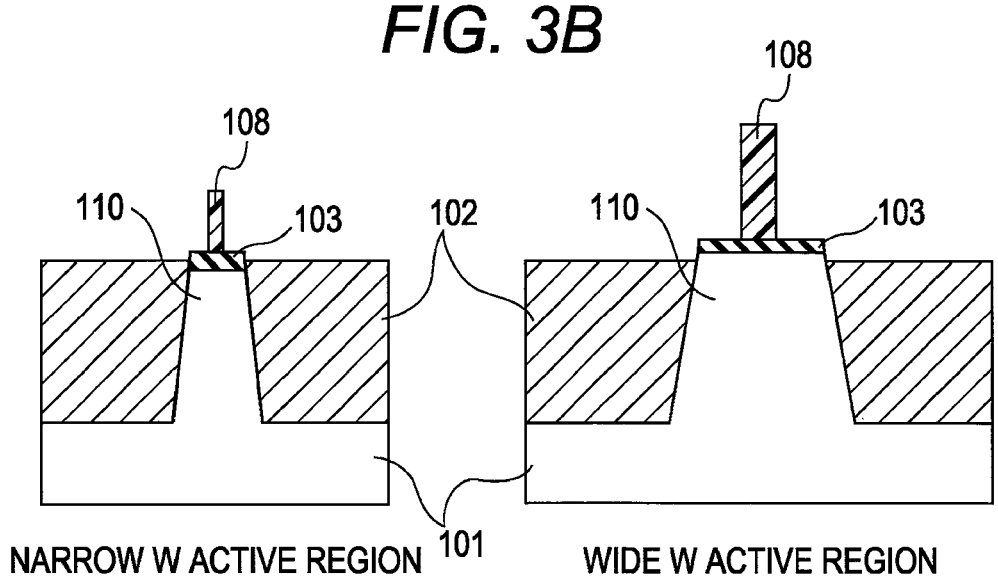

Considering the situation in which transistors of different types are mixedly mounted or the diversification of the size of the active region, the design of the step of the STI becomes more significant, and two points described below may be considered as new subjects. First, the step between the active region and the STI region differs for every type of transistor mixedly mounted. Second, even in the transistors of the same type, variation in the oxidation amount according to the change of the size in the active region is produced in an oxide film formation process depending on the design of the step between the active region and the STI, so that the step also differs.

In the present embodiment, correction data on which at least one of several types of transistors mixedly mounted to a wafer and a difference in a size of an active region is reflected is acquired and generated, so as to perform an OPC to a mask pattern. A size of a pattern actually formed is made uniform by using the correction data that considers a variation in a step due to a difference in types of transistors or the difference in the size of the active region.

The correction data is acquired in such a manner that various patterns, for example line and space patterns, for a size of the active region are formed, and the difference from the design value is measured. Alternatively, the correction data is acquired by repeating this process for a type of transistor.

The OPC data correction is performed for the type of the transistor or the size of the active region, whereby the correction of a mask pattern can be carried out that considers the variation in the size of the gate electrode in the patterning caused by the variation in the thickness of the reflection preventing film, caused by the step or the variation in an etching shift amount.

By using the photomask whose pattern is thus corrected, the difference between the size of the gate electrode actually formed and the design value is absorbed, whereby a highly-precise gate size can be obtained under an environment where a step amount exists. FIG. 4 is a flowchart showing a correction of a mask pattern in a fabrication process of a semiconductor device according to the embodiment.

Firstly, design data of a mask pattern is input to a data processing apparatus at step S11. This design data is, for example, layout data of each layer of a semiconductor device having different types of transistors mixedly mounted thereto.

At step S12, first correction data considering an etching shift and a size of an active region is acquired, and at step S13, a rule-based OPC is performed by using this correction data. The method of acquiring the first correction data will be described in detail with reference to FIG. 5. At step S14, second correction data considering that the lithography is acquired, and at step S15, a model-based OPC is performed using this correction data. At step S16, exposure data is created from the design data after the OPC processing so as to produce a photomask based upon the exposure data. At step S17, a pattern exposure is actually carried out by using the produced photomask to form a pattern of the semiconductor device on a wafer.

In the example of the correction of the mask pattern, the rule-based OPC in the step S13 and model-based OPC in the step S15 are carried out. A general rule-based OPC is a method of correcting the input design data on the basis of a correction amount according to a line width (L) of a circuit pattern or a distance (S) to the adjacent circuit pattern. The model-based OPC is a method of correcting the mask pattern by using an optical-intensity simulation, and it is suitable for the correction of a circuit pattern having a complicated shape for which the correction by the rule-based OPC is difficult.

In the rule-based OPC in the present embodiment, not only the correction amount according to only the change in the circuit pattern is used as the correction data, but also the correction amount considering the change in the size of the active region is acquired and used as the correction data.

Figure 5:
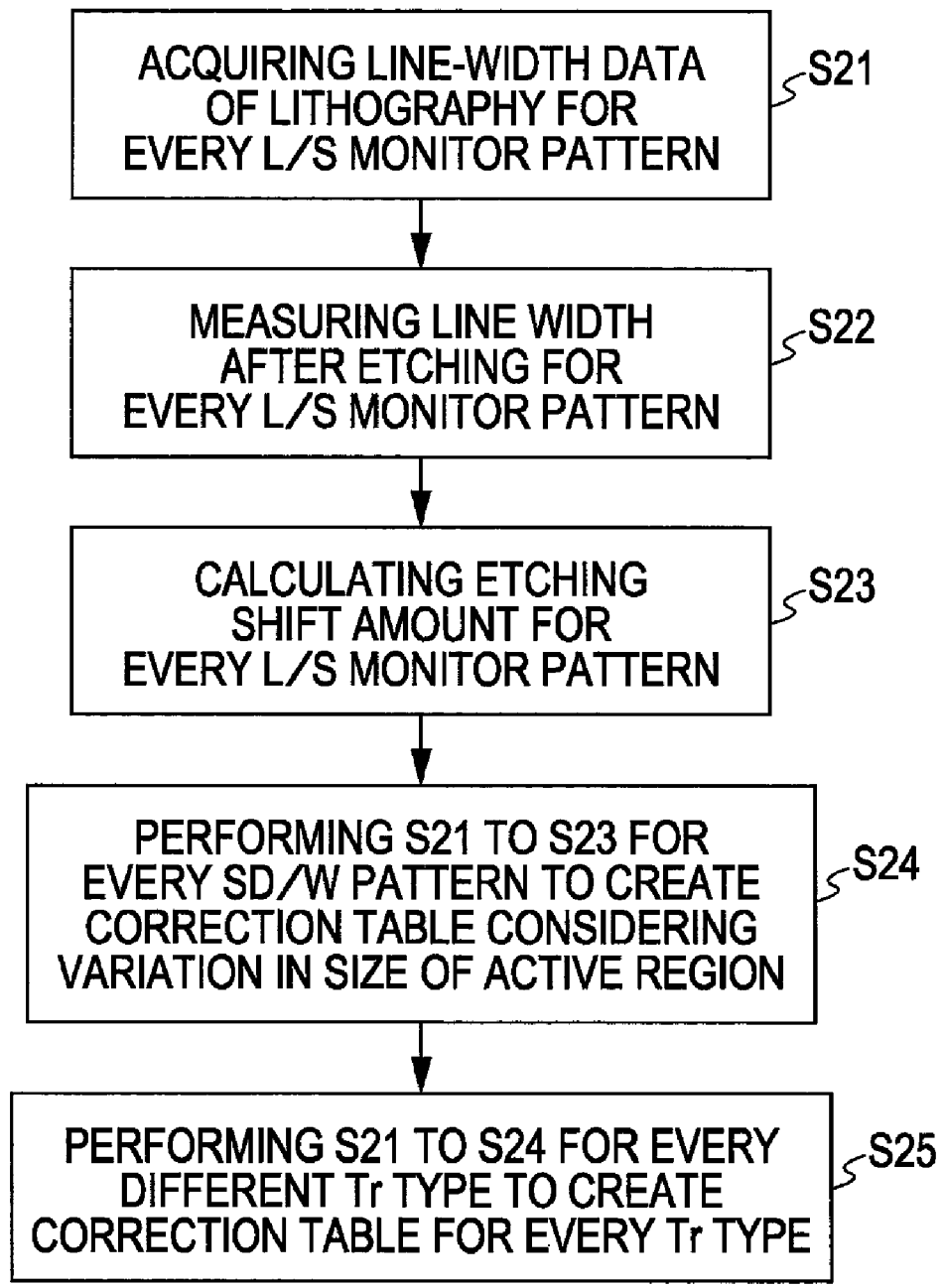
FIG. 5 is a flowchart showing an example of acquiring correction data in a correction data acquiring step in FIG. 4.

FIG. 5 is a flowchart showing a process of acquiring the first correction data executed at step S12 in FIG. 4. Firstly, at step S21, line-width data of the lithography is acquired for each of various combinations referred to as L/S monitor pattern of the line width and the distance (S). At step S22, the line width after the actual etching processing is measured for each of the L/S monitor patterns. At step S23, the difference between the line-width data and the measured value after the etching is obtained for each of the L/S monitor patterns, and the obtained difference is defined as an etching shift amount.

Figure 6:
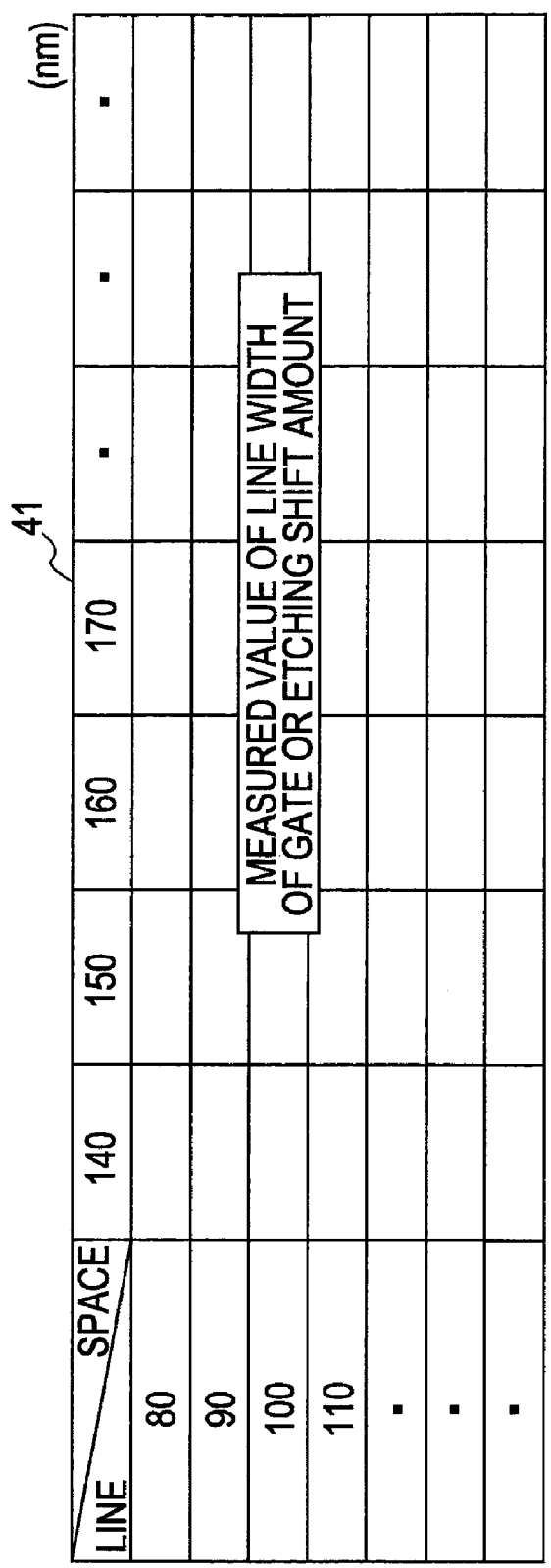
FIG. 6 is one example of an L/S monitor pattern table that specifies a correction value for every L/S monitor pattern.

At this stage, an L/S monitor pattern table 41 shown in FIG. 6 is created. In each entry of the L/S monitor pattern table 41 in FIG. 6, the measured value, measured at step S22, of the gate line width after the etching may be recorded as a correction value instead of the etching shift amount calculated at step S23 or together with the etching shift amount. In the rule-based OPC, when the adjacent circuit patterns are separated from each other by a fixed distance, for example, the width of the circuit pattern is increased, or when the adjacent circuit patterns are close to each other, the width of the circuit pattern is reduced, according to the correction value specified on the L/S monitor pattern table 41.

Subsequently, in the present embodiment, a monitoring in which active regions, hereinafter referred to as SD/W pattern, whose SD width and W width are changed in various ways are arranged immediately below the gate in order to employ the size, for example W width or SD width, of the active region, which is the base, as a parameter of the correction.

Figure 7:
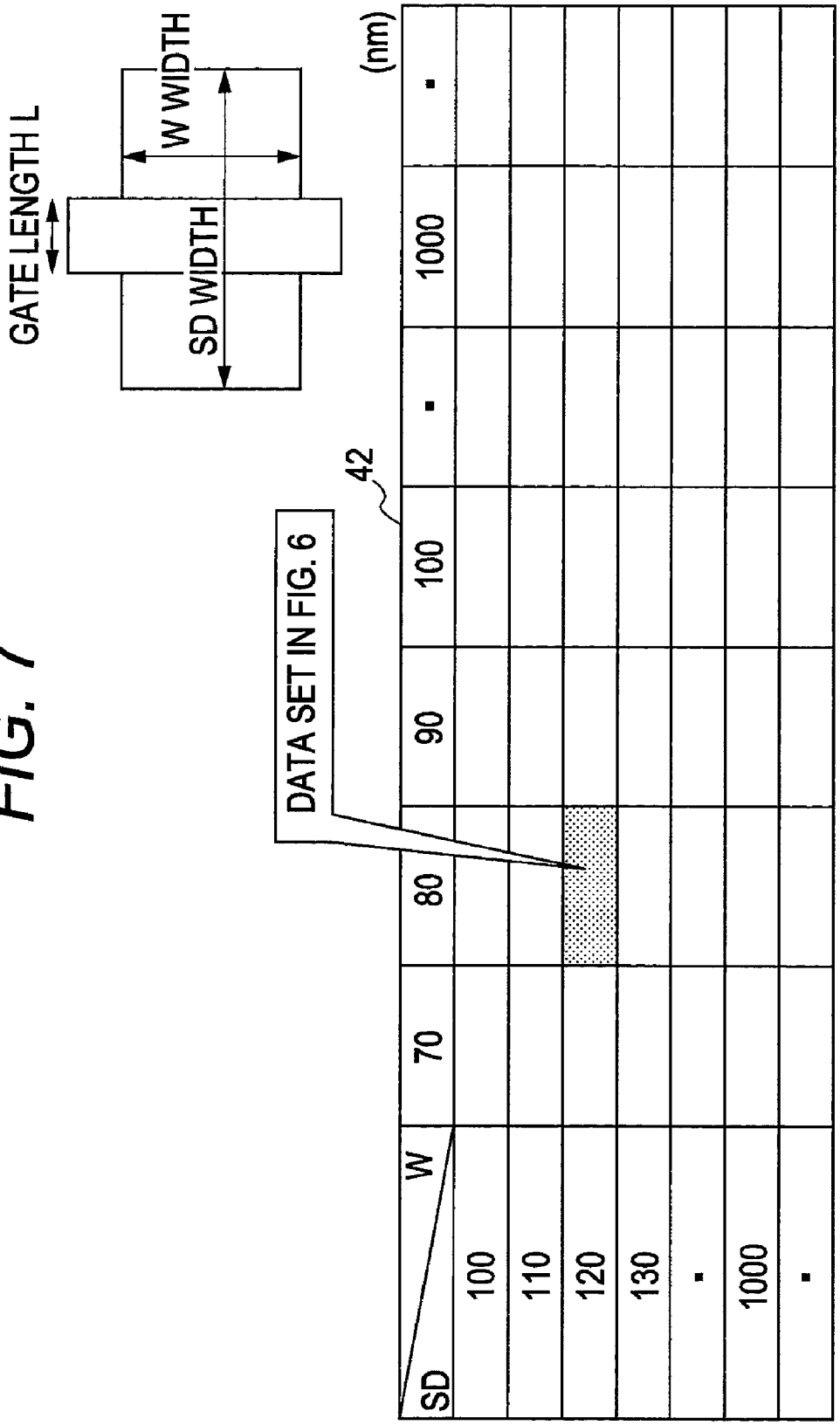
FIG. 7 is one example of correction table considering the variation in a size of an active region used for correcting input design data.

At step S24 in FIG. 5, a wafer is prepared in which STI is formed such that active regions having various sizes used for monitoring are sectioned, the processing at steps S21 to S23 is performed for each of the active regions having different sizes so as to form a monitor pattern and perform a pattern measurement, whereby a correction table 42 shown in FIG. 7 is created. The correction table 42 is formed such that the L/S monitor pattern table 41 shown in FIG. 6 is taken into each entry of an SD/W matrix in order to reflect the affect of the base on the correction of the L/S monitor patterns. Since the change in the size of the active region is reflected on each gate pattern, the correction data considering the affect of the step due to the size of the active region can be obtained.

Figure 8:
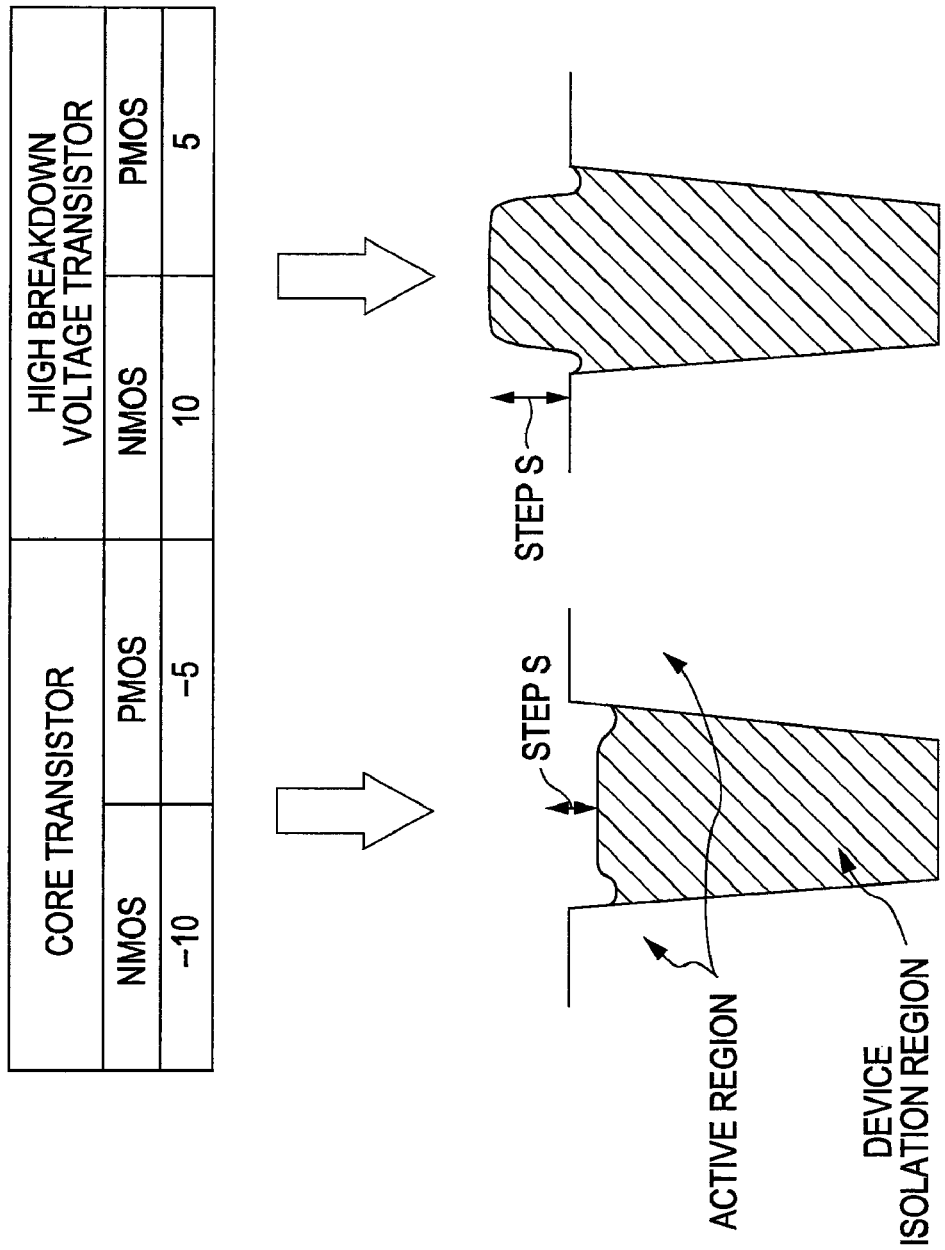
FIG. 8 is a view showing a difference of a step caused by a difference of a type of a transistor.

In the present embodiment, steps S21 to S24 are repeated for each of different types of transistors at step S25 in order to correct the step for each of different types of transistors mixedly mounted to the wafer, thereby creating the correction table 42 for every type of transistors. The table in FIG. 8 illustrates the step of the STI. In the case of a core transistor, an oxide film embedded into a device isolation trench is recessed lower than the active region, so that when the active region is defined as a reference, a negative step S is produced. In the case of a high breakdown voltage transistor, a positive step S that protrudes from the active region appears. The step amount is different depending upon NMOS or PMOS, even in the same core transistor or the same high breakdown voltage transistor. In view of this, the correction table 42 shown in FIG. 7 is created for every type of transistor including a conductive type, so as to correct the design data input on the basis of the correction data. It is to be noted that, when the degrees of the steps of the STI are the same or when there is little difference in the steps of the STI, the correction table 42 may be shared between two or more types of transistors.

In FIG. 4, a model-based OPC is carried out subsequent to the rule-based OPC using the correction table 42 in the embodiment. In this example, the model-based OPC uses the correction data considering only the lithography. The reason for this is because, since the model-based correction is the correction on the basis of the optical-intensity simulation, it becomes difficult to perform the correction to the process factor other than the lithography, for example etching shift amount indicating the influence by the etching.

Figure 9:
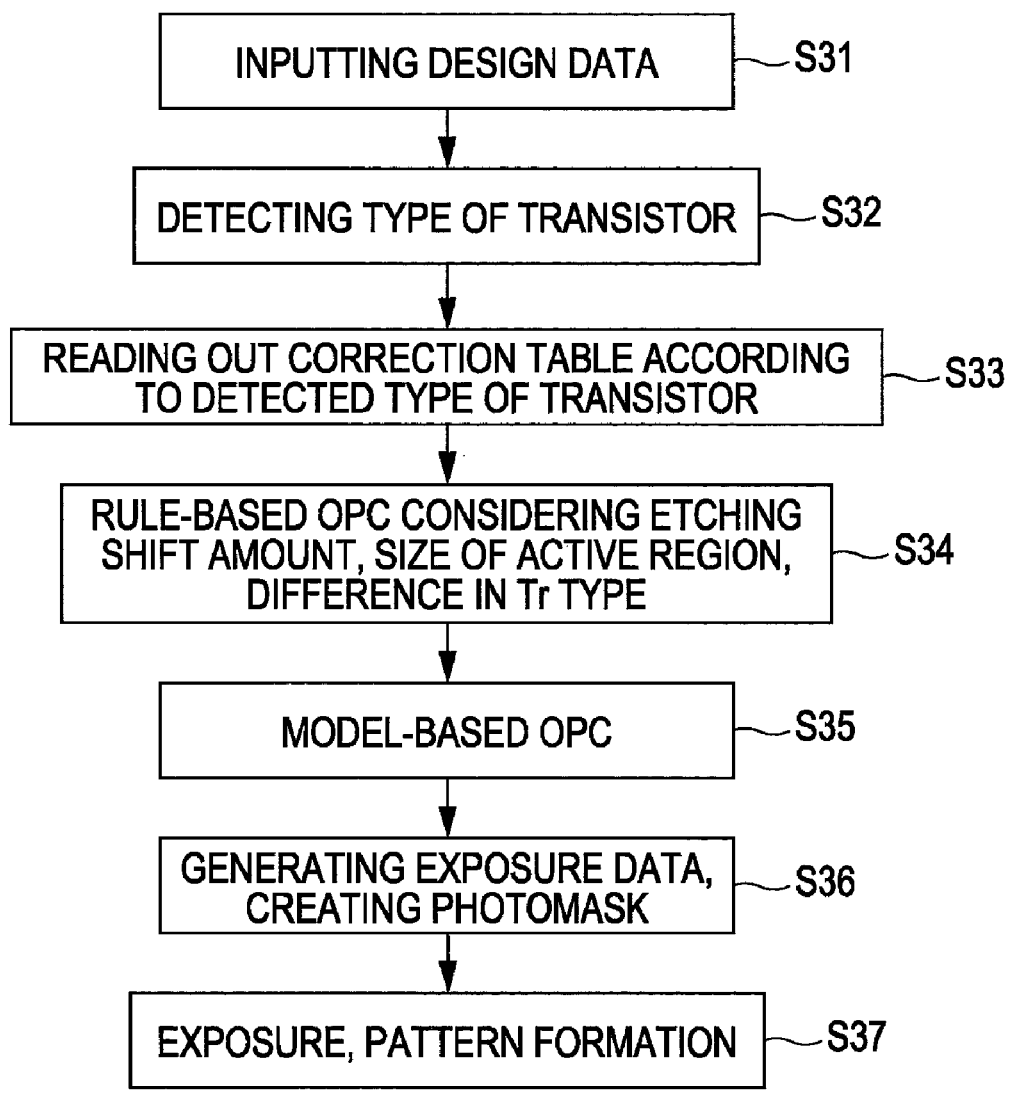
FIG. 9 is a flowchart showing a correction of a mask pattern when fabricating a semiconductor device having transistors of different types mixedly mounted thereto.

FIG. 9 is a modification of a flow of the pattern correction in FIG. 4, wherein the process flow in FIG. 4 is applied to the correction of a mask pattern for a wafer having different types of transistors mixedly mounted thereto. At step S31, design data is input to a data processing apparatus, and at step S32, the type of the transistor that is the subject of the correction is detected. At step S33, a correction table 42 according to the detected type of the transistor is read out. At step S34, the rule-based OPC is performed using the correction table 42. Since the correction amount for each of the SD/W patterns according to the size of the active region of the base is specified in the correction table 42 in addition to the correction amount for each of the L/S monitor patterns as described above, the type of the transistor, the size of the active region, and the etching shift amount are all reflected on the rule-based OPC performed at step S34.

Thereafter, at step S35, the model-based OPC is performed using the correction data considering the lithography, for example. Exposure data is generated at step S36 for creating a photomask. Finally, an exposure is carried out using the created photomask so as to form a pattern of a semiconductor device on the wafer at step S37.

Figure 10:
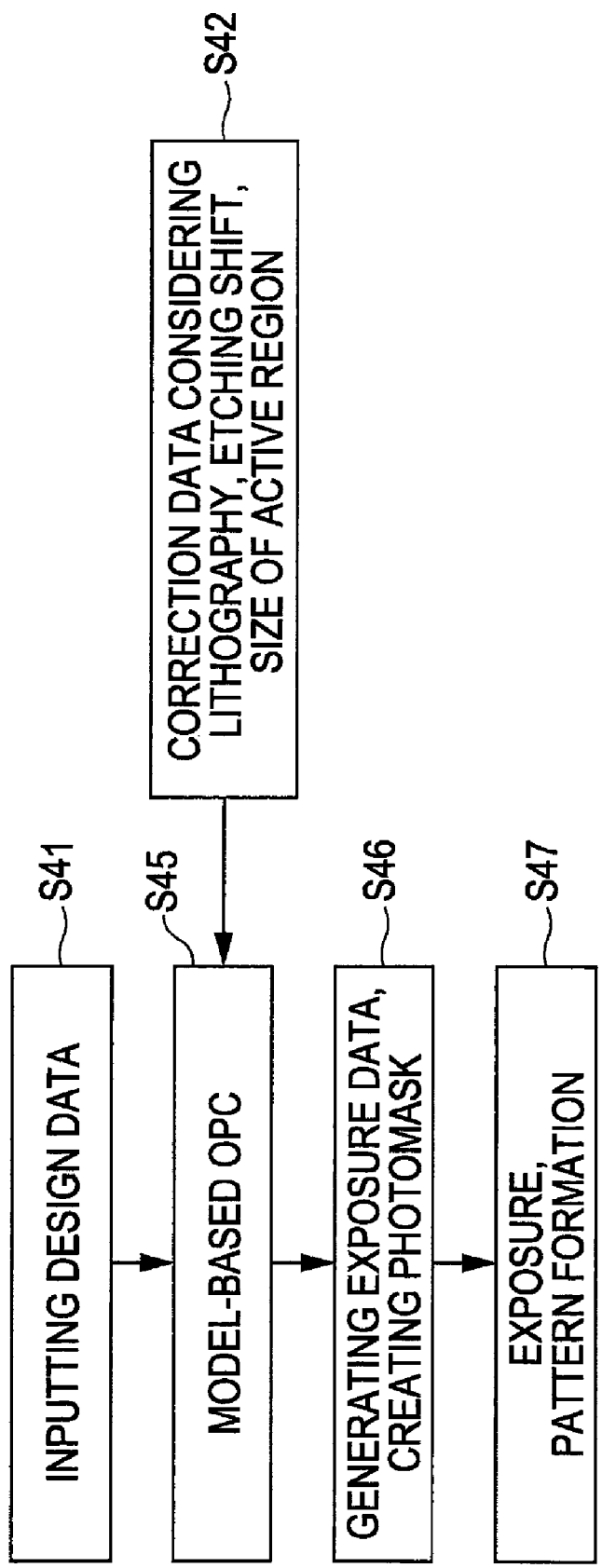
FIG. 10 is a flowchart showing a correction for executing only a model-based OPC using the correction data considering the size of the active region.

FIG. 10 is another modification of a flow of the pattern correction in FIG. 4. In this modification, only the model-based OPC is carried out. When performing the model-based OPC, the correction data considering the lithography, etching shift, and the size of the active region is used. Specifically, the correction data acquired at step S42 is used to the design data of the mask pattern input at step S41 for performing the model-based OPC at step S45. The correction data acquired at step S42 is, for example, the one in which the line-width data of the lithography for each of the L/S patterns obtained at step S21 in FIG. 5 and the etching shift amount for each of the L/S patterns obtained at step S23 are taken into each box of the correction table 42 in FIG. 7.

Subsequently, exposure data is generated at step S46 from the design data after the model-based OPC processing so as to create a photomask. At step S47, an exposure is carried out using the created photomask, thereby forming a pattern composing a semiconductor device on the wafer.

This correction method is advantageous because it can cope with the correction of a micropattern with one OPC processing. When this correction is performed to the mask pattern of a wafer having different types of transistors mixedly mounted thereto, the type of the transistor, which is the subject of the correction at this time, is detected, and the correction table according to the detected type is read so as to perform the model-based OPC as illustrated in steps S32 and S33 in FIG. 9.

Finally, the formation of the monitor pattern for acquiring the correction data in the aforesaid pattern correction method will be explained. The correction data can be acquired by mounting a monitor for acquiring the correction data to a real device evaluation mask. On the other hand, one type of the mixedly mounted transistors is manufactured on the whole surface of each wafer with the test mask for the L/S monitor pattern, in order to acquire data. Alternatively, a full-process mask set for a test evaluation may be prepared so as to acquire the correction data. Further, a series of pattern sets are arranged for every possible type of mixedly mounted transistors, and the pattern sets may be transferred and subject to an etching processing so as to acquire the correction data.

The monitor pattern for acquiring the correction data is mounted to the device evaluation mask for every type of mixedly mounted transistors. The measuring monitor to be used is the combination of those shown in FIGS. 6 and 7 on which all types of the mixedly mounted transistors are reflected.

In the test mask for acquiring the OPC data, a mask pattern whose data is corrected in accordance with the size of the active region is formed for every type of transistor, and the monitor pattern of one of the types of the mixedly mounted transistors is processed and formed for every wafer to measure the etching shift. Only the combination of FIGS. 6 and 7 is considered in each wafer. In this case, the number of measured wafers becomes the number of types of the mixedly mounted transistors, whereby the number of the masks is reduced, although the number of the processed wafers is increased.

In the test mask for acquiring the OPC data, a reticle for ion implantation is also formed, and the correction data for every type of mixedly mounted transistor is acquired with the full-process mask set whose number is the same as the number of the device samples. The measuring monitor to be used is the combination of those shown in FIGS. 6 and 7 on which all types of the mixedly mounted transistors are reflected.

According to the technique described above, the correction of the OPC data for every type of mixedly mounted transistor and every size of an active region, which have not been considered in a conventional correction technique, can be performed. As a result, a pattern correction considering the variation in the patterning size due to the variation in thickness of a reflection preventing film caused by a step or a variation in an etching shift amount can be executed.

What is claimed is:
1. A method of manufacturing a semiconductor device comprising:
    creating design data including a plurality of active region pattern data and a plurality of gate electrode pattern data;
    creating a correction table specifying relationship between a plurality of size of active region and a plurality of amount of correction of a mask pattern;
    extracting gate pattern data corresponding to a first gate electrode from the design data, and identifying a size of a first active region which the first gate electrode is formed above;
    wherein the size of the first active region is different from a size of a second active region to be formed utilizing the mask pattern,
    deciding an amount of correction of the mask pattern of the first gate electrode based on the difference in the size of the first active region to the second active region as correlated in the correction table by a data processing apparatus;
    correcting the mask pattern on the basis of the decided amount of the correction;
    forming the first active region in a semiconductor substrate;
    depositing a first film over the first active region;
    forming a resist film over the first film;
    exposing the resist film by using an exposure mask having the corrected mask pattern; and etching the first film by using the exposed resist film to form the first gate electrode.

2. The method of claim 1, wherein the first active region is surrounded by a device isolation region, and there is a step between the first active region and the device isolation region.

3. A method of correcting a mask pattern comprising:
creating design data including a plurality of active region pattern data and a plurality of gate electrode pattern data;
creating a correction table specifying a relationship between a plurality of sizes of an active region and a plurality of amounts of correction of a mask pattern;
extracting gate pattern data corresponding to a first gate electrode from the design data, and identifying a size of a first active region which the first gate electrode is formed above;
wherein the size of the first active region is different from a size of a second active region to be formed utilizing the mask pattern,
deciding an amount of correction of the mask pattern of the first gate electrode based on the difference in the size of the first active region to the second active region as correlated in the correction table by a data processing apparatus; and
correcting the mask pattern according to the decided amount of the correction.

4. The method of claim 3, wherein
the amount of the correction, which is performed to the mask pattern, is decided for a type of the transistor to which the mask pattern is transferred, and the mask pattern is corrected on the basis of the decided amount of the correction.

5. The method of claim 3, wherein the mask pattern is transferred to a wafer in which a device isolation region is formed so as to divide the first active region, a width of the transferred mask pattern is measured, and the measured value is employed as the amount of the correction.

6. The method of claim 3, wherein the mask pattern is incorporated into a device testing mask, an exposure is carried out by using the device testing mask so as to transfer the mask pattern to a wafer, and
the transferred pattern is measured so as to acquire the amount of the correction.

7. The method of claim 3, wherein the correction table is created for the size of the active region, and a line width of the mask pattern and a space between the mask pattern and the adjacent mask pattern.

8. The method of claim 3, wherein the correction of the mask pattern is carried out by performing a model-based optical proximity correction to the design data with the use of the amount of the correction decided for the size of the active region.

9. The method of claim 3, further comprising:
performing a model-based optical proximity correction using an optical-intensity simulation.

10. The method of claim 4, wherein the type of the transistor is specified by an operation voltage or breakdown voltage of the transistor.

* * * * *